United States Patent
Ruan et al.

(10) Patent No.: US 12,557,566 B2
(45) Date of Patent: Feb. 17, 2026

(54) SEMICONDUCTOR DEVICE HAVING A SWITCHING LAYER INCLUDING A COMPOUND HAVING ALUMINUM, OXYGEN, AND NITROGEN AND METHOD FOR MANUFACTURING THE SAME

(71) Applicant: Taiwan Semiconductor Manufacturing Company, Ltd., Hsinchu (TW)

(72) Inventors: Sheng-Siang Ruan, Hsinchu (TW); Chia-Wen Zhong, Hsinchu (TW); Tzu-Yu Lin, Hsinchu (TW); Ching Ju Yang, Hsinchu (TW); Yao-Wen Chang, Hsinchu (TW); Chin I Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 396 days.

(21) Appl. No.: 18/177,397

(22) Filed: Mar. 2, 2023

(65) Prior Publication Data
US 2024/0298555 A1    Sep. 5, 2024

(51) Int. Cl.
*H10N 70/00*    (2023.01)
*H10N 70/20*    (2023.01)
*H01J 37/32*    (2006.01)

(52) U.S. Cl.
CPC ....... *H10N 70/8416* (2023.02); *H10N 70/023* (2023.02); *H10N 70/026* (2023.02); *H10N 70/063* (2023.02); *H10N 70/245* (2023.02); *H10N 70/883* (2023.02); *H01J 37/32091* (2013.01); *H01J 2237/3321* (2013.01)

(58) Field of Classification Search
CPC ............ H10N 70/8416; H10N 70/883; H10N 70/026; H10N 70/063; H10N 70/023; H10N 70/245; H01J 37/32091; H01J 2237/3321
USPC ............................................................ 257/4
See application file for complete search history.

(56) References Cited

U.S. PATENT DOCUMENTS

| | | | |
|---|---|---|---|
| 9,142,764 B1* | 9/2015 | Wang | H10N 70/24 |
| 2014/0175361 A1* | 6/2014 | Hsueh | H10N 70/8833 257/4 |
| 2020/0052203 A1* | 2/2020 | Trinh | H10N 70/24 |
| 2020/0066794 A1* | 2/2020 | Yasuda | H10B 63/84 |
| 2022/0149200 A1* | 5/2022 | Park | G06N 3/065 |

FOREIGN PATENT DOCUMENTS

| | | | | |
|---|---|---|---|---|
| CN | 114725280 A | * | 7/2022 | ............... C22C 5/04 |
| KR | 20130118095 A1 | * | 10/2013 | |
| WO | WO-2016160001 A1 | * | 10/2016 | |

* cited by examiner

*Primary Examiner* — Phuc T Dang
(74) *Attorney, Agent, or Firm* — Foley & Lardner LLP

(57) ABSTRACT

A semiconductor device that includes a semiconductor substrate, a bottom electrode over the semiconductor substrate, a switching layer over the bottom electrode, a metal ion source layer over the switching layer, and a top electrode over the metal ion source layer. The switching layer includes a compound having aluminum, oxygen, and nitrogen.

20 Claims, 16 Drawing Sheets

SEMICONDUCTOR DEVICE HAVING A SWITCHING LAYER INCLUDING A COMPOUND HAVING ALUMINUM, OXYGEN, AND NITROGEN AND METHOD FOR MANUFACTURING THE SAME

BACKGROUND

Conductive-bridging random access memory (CBRAM) devices, alternatively referred to as solid electrolyte RAM devices, are promising candidates for next generation non-volatile memory technology due to their simple structure and compatibility with complementary metal-oxide-semiconductor (CMOS) logic fabrication processes. While methods of fabricating CBRAM devices are generally adequate, they have not been entirely satisfactory in all aspects. For example, in an effort to lower power consumption and achieve more environmentally conscious memory devices, it may be desirable to fabricate DBRAM devices with reduced forming voltages.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
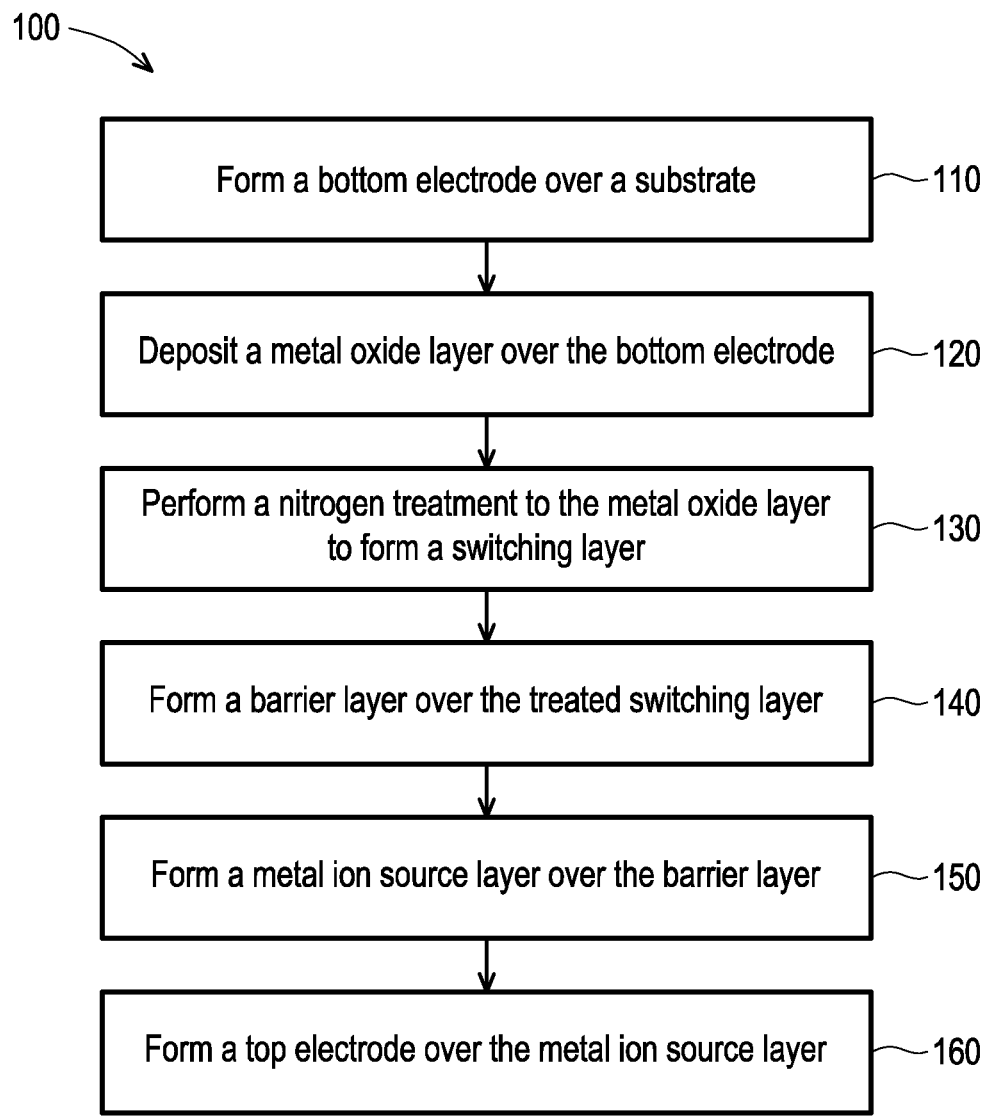
FIG. 1 is a flow chart illustrating a method for manufacturing a semiconductor device, according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In one or more embodiments of the present disclosure, a semiconductor device, such as a conductive-bridging random access memory (CBRAM) device, includes a nitrogen-containing switching layer as a solid electrolyte between a top electrode and a bottom electrode. The nitrogen-containing switching layer includes a nitrogen-doped metal oxide, such as nitrogen-doped aluminum oxide, that may be formed by depositing a metal oxide layer over the bottom electrode and performing a nitrogen treatment to dope the metal oxide layer. Some embodiments provide that introducing nitrogen to the metal oxide layer lowers the bandgap of the metal oxide, thereby increasing the conductivity of the switching layer. The increased conductivity may lead to a lowered forming voltage required to activate the CBRAM device and thus lowered power consumption for the device.

FIG. 1 is a flow chart illustrating a method for manufacturing a semiconductor device according to various aspects of one or more embodiments of the present disclosure. The method 100 begins with operation 110 in which a bottom electrode 12 is formed over a substrate 11. The method 100 proceeds to operation 120 in which a metal oxide layer 14 is deposited over the bottom electrode 12. The method 100 proceeds to operation 130 in which a nitrogen treatment is performed to the metal oxide layer 14 to form a switching layer 16 over the bottom electrode 12. The method 100 proceeds to operation 140 in which a barrier layer 18 is formed over the switching layer 16. The method 100 proceeds to operation 150 in which a metal ion source layer 20 is formed over the barrier layer 18. The method 100 proceeds to operation 160 in which a top electrode 22 is formed over the metal ion source layer 20.

The method 100 is described in reference to FIGS. 2-7, which are cross-sectional schematic views of a semiconductor device 10 at intermediate stages of the method 100 according to some embodiments of the present disclosure. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
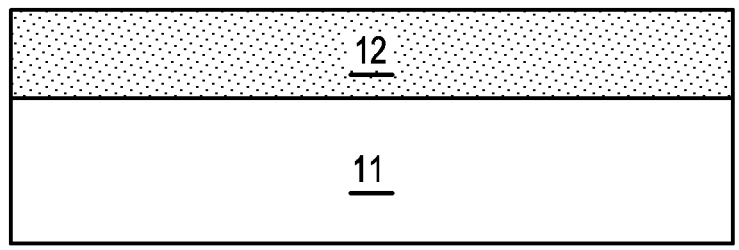
FIGS. 2, 3, 4, 5, 6, and 7 are cross-sectional schematic views of a semiconductor device at various operations of the method as shown in FIG. 1, according to one or more embodiments of the present disclosure.

As shown in FIG. 2, the method 100 begins with operation 110 in which a bottom electrode 12 is formed over a substrate 11. The substrate 11 may be a semiconductor substrate, such as a bulk semiconductor, a semiconductor-on-insulator (SOI) substrate, or the like, which may be doped (e.g., with a p-type or an n-type dopant) or undoped. The substrate 11 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 11 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, semiconductor components such as transistor components, electronic components such as resistor components, capacitor components, or inductor components, and circuit layers may be formed in or over the substrate 11.

As shown in FIG. 2, the bottom electrode 12 is formed over the substrate 11. Although the bottom electrode 12 is depicted to be contacting the substrate 11, other material layers may be formed between the substrate 11 and the bottom electrode 12 according to some embodiments of the present disclosure. The bottom electrode 12 includes a conductive material. Examples of the conductive material for the bottom electrode 12 include a metal, such as tungsten, copper, gold, or the like, a metal nitride, such as titanium nitride, tantalum nitride, or the like, a doped semiconductor material, such as polycrystalline silicon or the like, or combinations thereof. In some embodiments, the bottom electrode 12 may be electrically connected to the semiconductor components, the electronic components, and/or the circuit layers formed on the substrate 11. The bottom electrode 12 may be formed by any suitable method, such as chemical vapor deposition (CVD), atomic layer deposition (ALD), physical vapor deposition (PVD), electroplating, electroless plating, the like, or combinations thereof. In some embodiments, the bottom electrode 12 may include a seed layer and a conductive bulk layer over the seed layer. In the present embodiments, the bottom electrode 12 may serve as a cathode (or a passive electrode) of the semiconductor device 10.

Figure 3:
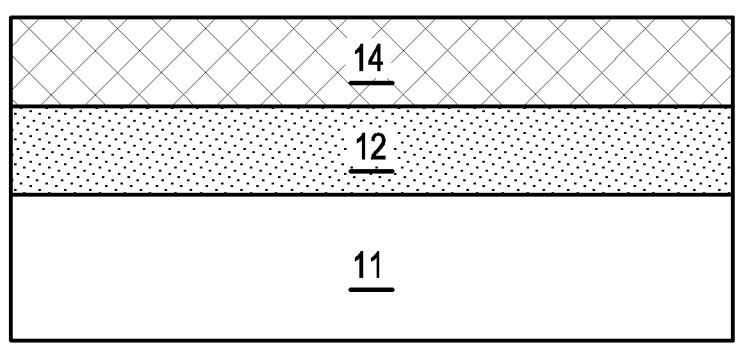
Figure 4:
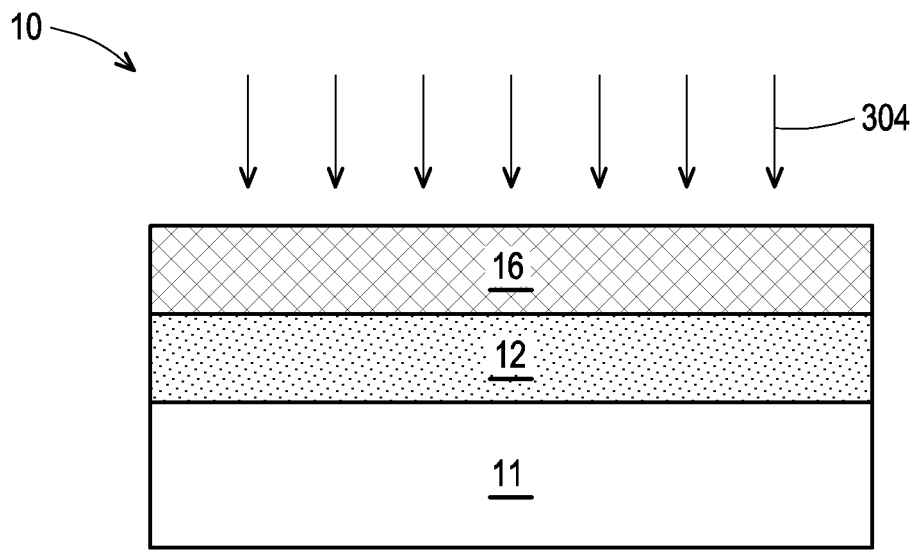

As shown in FIGS. 3 and 4 collectively, the method 100 proceeds to forming a switching layer 16 over the bottom electrode 12 at operations 120 and 130.

In some embodiments, the switching layer 16 is configured as a solid electrolyte layer interposed between and electrically coupled to two electrodes (i.e., the bottom electrode 12 and a subsequently-formed top electrode, e.g., a top electrode 22) of the semiconductor device 10, which may be a conductive-bridging random access memory (CBRAM) device. In this regard, the CBRAM device may alternatively be referred to as a solid electrolyte RAM device. Conductive filaments (or conductive bridges) comprising metal ions may be formed or erased within the solid electrolyte by applying voltages (e.g., positive bias and negative bias) across the electrodes. In other words, depending on the voltage applied between the two electrodes, the switching layer 16 may be cycled between a high resistance state (HRS) and a low resistance state (LRS) by the forming and erasing of conductive paths, thereby providing variable resistance in the semiconductor device 10. The switching layer 16 may be or include a data storage region configured to store data. The variable resistance of the data storage region may represent a data unit, such as a bit of data.

In some embodiments, the switching layer 16 includes a dielectric material containing a metal, oxygen, and nitrogen. In the present embodiments, the metal included in the dielectric material of the switching layer 16 is aluminum. In some embodiments, the dielectric material of the switching layer 16 includes at least about 5 atomic % but not exceeding about 10 atomic % of nitrogen. In some embodiments, the dielectric material of the switching layer 16 includes about 55 atomic % to about 60 atomic % of oxygen. In other words, the amount of oxygen included in the dielectric material of the switching layer 16 is greater than that of nitrogen, which is greater than about 5 atomic %. Alternative or in addition to aluminum, the dielectric material may include another metal, such as hafnium, tantalum, nickel, titanium, the like, or combinations thereof. In some instances, the dielectric material of the switching layer 16 may be considered a nitrogen-doped metal oxide. For example, in the present embodiments, the switching layer 16 includes a nitrogen-doped aluminum oxide, which may be formed in a multi-step process as discussed in detail below.

Referring to FIG. 3, the method 100 proceeds to operation 120 in which a metal oxide layer 14 is deposited over the bottom electrode 12 by a deposition process 302. In the present embodiments, the metal oxide layer 14 includes aluminum and oxygen in the form of aluminum oxide. In some examples, an amount of aluminum (in the form of aluminum ions) is about 35 atomic % and an amount of oxygen (in the form of oxygen ions) may be about 65 atomic % in the metal oxide layer 14, though the present disclosure is not limited to such compositions. For example, the aluminum ions and oxygen ions may be arranged in any stoichiometric ratios suitable for the present disclosure. For this reason, the aluminum oxide in the metal oxide layer 14 may be schematically expressed as AlO for purposes of simplicity in the remainder of the present disclosure. The deposition process 302 may be a PVD process, a CVD process, or the like. In some embodiments, the metal oxide layer 14 is formed to a thickness of about 10 angstroms to about 40 angstroms, though the present disclosure is not limited to such dimensions. On one hand, a thickness of less than about 10 angstroms may lead to an unstable film. On the other hand, a thickness of greater than about 40 angstroms may cause subsequent treatment (e.g., nitrogen treatment 304) to be limited to a surface region, rather than through the entire thickness, of the metal oxide layer 14.

Referring to FIG. 4, the method 100 proceeds to operation 130 in which a nitrogen treatment 304 is performed to the metal oxide layer 14, thereby forming a nitrogen-doped (or nitrogen-containing) metal oxide that is the switching layer 16. In the present embodiments, the nitrogen treatment 304 is implemented using nitrogen plasma, which reacts with the metal oxide in the metal oxide layer 14 to form the nitrogen-doped metal oxide. For embodiments in which the metal oxide layer 14 includes aluminum oxide, a chemical reaction between aluminum oxide and nitrogen may be schematically expressed as

$$AlO + N_2 + NH_3 \rightarrow AlON + H_2 + N_2 + NH_3,$$

where $N_2$ is implemented as nitrogen plasma and $NH_3$ is implemented as a carrier gas. In some embodiments, thermal energy (or heat) is applied to the semiconductor device 10 during the chemical reaction. For example, the substrate 11 having the metal oxide layer 14 formed thereover may be heated by a substrate stage in a processing chamber in which the nitrogen treatment 304 is implemented. In some embodiments, reaction byproducts including $H_2$, $N_2$, and $NH_3$ are subsequently removed after performing the nitrogen treatment 304 to isolate the nitrogen-doped aluminum oxide (AlON) as the switching layer 16.

In the present embodiments, the nitrogen plasma is produced by a capacitively coupled plasma (CCP) source, which is typically generated by two electrodes connected to a radio-frequency (RF) power supply. The CCP source may be configured to produce nitrogen plasma having an electron density of less than about $3.0\times10^9$ cm$^{-3}$, the electron density corresponding to a strength of the nitrogen plasma applied to the metal oxide layer 14. In this regard, an increase in the strength of the nitrogen plasma results in an increased amount of nitrogen incorporated into the switching layer 16, and vice versa. In the present embodiments, the nitrogen plasma is produced by a CCP source having an electron density of about $0.5\times10^9$ cm$^{-3}$ to about $1.5\times10^9$ cm$^{-3}$. At an electron density of less than about $0.5\times10^9$ cm$^{-3}$, the metal oxide layer 14 may be under-treated with nitrogen, such that the resulting switching layer 16 may not include an adequate amount of nitrogen for improvement in device performance. In the contrary, at an electron density of greater than about $1.5\times10^9$ cm$^{-3}$, the metal oxide layer 14 may be over-treated with nitrogen, such that the resulting switching layer 16 may include an excessive amount of nitrogen, leading to inadvertent penetration of nitrogen atoms into the bottom electrode 12. In some embodiments, an amount of nitrogen introduced to the switching layer 16 may be controlled by adjusting various parameters of the nitrogen treatment 304 including, for example, a flow rate of the nitrogen gas, chamber pressure, power of the CCP source, temperature of the substrate stage in the processing chamber, or other parameters. In some examples, the flow rate may be about 12500 sccm to about 22000 sccm, the chamber pressure may be about 1 Torr to about 10 Torr, the power of the CCP source may be about 600 W and the temperature of the substrate stage may be about 250° C.

In the present embodiments, doping the metal oxide layer 14 with nitrogen during the nitrogen treatment 304 substitutes some of the oxygen ions with nitrogen ions, leading to the formation of a nitrogen-containing metal oxide having a "nitrogen-metal-oxygen" structure. For embodiments in which the metal oxide layer 14 includes aluminum oxide (AlO), for example, the nitrogen treatment 304 replaces some of the Al—O bonds with Al—N bonds to form the nitrogen-doped aluminum oxide with a simplified structure of N—Al—O. Generally, aluminum nitride (e.g., including Al—N bonds) has a lower bandgap (e.g., between about 6 eV to about 7 eV at room temperature) than aluminum oxide (AlO), which is considered a dielectric material having a bandgap of about 9 eV at room temperature. The relatively lower bandgap of aluminum nitride corresponds to a higher conductivity, where the lower bandgap may be attributed to a lower bonding strength of the Al—N bonds compared to the Al—O bonds. Accordingly, in comparison to an aluminum oxide-containing switching layer that is nitrogen-free, performing the nitrogen treatment 304 lowers the bandgap of aluminum oxide and thus increases the conductivity of aluminum oxide in the switching layer 16.

In some embodiments, such increase in conductivity increases with the amount of nitrogen included in the switching layer 16, and may subsequently result in a lowered forming voltage ($V_f$) of the semiconductor device 10, which is the voltage required to activate or turn on a CBRAM device by establishing a conductive filament between a top electrode and a bottom electrode. In some embodiments, increasing the electron density (i.e., the strength) of the nitrogen plasma produced by the CCP source from about $0.5\times10^9$ cm$^{-3}$ to about $1.5\times10^9$ cm$^{-3}$ increases an amount of nitrogen introduced in the switching layer 16, thereby increasing the conductivity of the switching layer 16. In some examples, the forming voltage of the semiconductor device 10 may be reduced by about 5% to about 7% after performing the nitrogen treatment 304. In some embodiments, performing the nitrogen treatment 304 reduces a density of the aluminum oxide (e.g., including Al—O bonds) in the switching layer 16. For instances, the density of aluminum oxide may decrease from 3.03 g/cm$^3$ to about 2.61 g/cm$^3$ after performing the nitrogen treatment 304 at operation 130.

In some embodiments, the amount of nitrogen introduced to the switching layer 16 by the nitrogen treatment 304 is about 5 atomic % to about 10 atomic %. With an amount of nitrogen in the switching layer 16 being less than about 5 atomic %, the effect of lowering the bandgap (and increasing the conductivity) is trivial and may not lead to a lowered forming energy for the semiconductor device 10. With an amount of nitrogen being greater than about 10 atomic %, the switching layer 16 may be considered over-treated with nitrogen, leading to a breakdown of its dielectric property that ensures the proper function of the semiconductor device 10. In some examples, too much nitrogen may penetrate the bottom electrode 12, compromising the performance of the semiconductor device 10 as a result.

In some embodiments, the deposition process 302 and the nitrogen treatment 304 are implemented by the same process and in the same processing chamber. In one example, the deposition process 302 may be a PVD process implemented in a PVD chamber configured with the CCP source as described above and the nitrogen treatment 304 may be implemented by a PVD process using the CCP source. In another example, the deposition process 302 may be a CVD process implemented in a CVD chamber configured with the CCP source and the nitrogen treatment 304 may be implemented by a CVD process using the CCP source.

In some embodiments, the deposition process 302 and the nitrogen treatment 304 are implemented by different deposition processes to optimize the overall quality of the switching layer 16. For example, the deposition process 302 may be a PVD process implemented in a PVD apparatus (e.g., chamber) and the nitrogen treatment 304 may be implemented by a CVD process in a CVD apparatus (e.g., chamber) configured with the CCP source. In some instances, the metal oxide layer 14 produced by a PVD process at operation 120 may include less impurity (e.g., byproducts including $H_2$), since no chemical process is involved during the deposition process. In some instances, the amount of nitrogen introduced during operation 130 may be controlled to a greater precision when implemented by the CVD process than by the PVD process as the CVD apparatus may be equipped with capabilities to adjust various operating conditions (e.g., temperature, pressure, flow, etc.) related to the nitrogen treatment 304.

Figure 5:
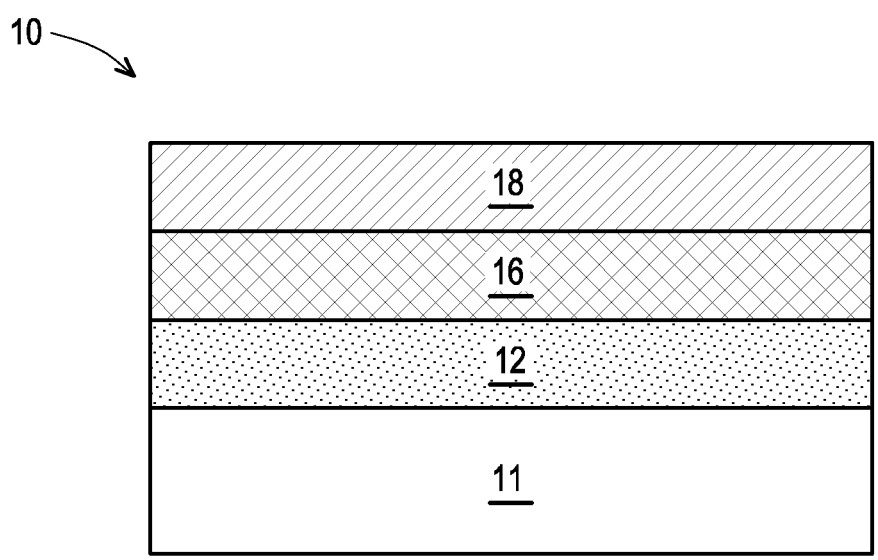

As shown in FIG. 5, the method 100 proceeds to operation 140 in which a barrier layer 18 is formed over the switching layer 16.

The barrier layer 18 may include an inert material or a less reactive material to the ions than a subsequently-formed top electrode (e.g., a top electrode 22), such that the barrier layer 18 may obstruct diffusion of ions between the switching layer 16 and the top electrode. In some embodiments, the barrier layer 18 may help prevent or retard metal ions (e.g., aluminum ions, copper ions, silver ions, aluminum ions, or the like, depending on the type of metal included in a subsequently-formed ion source layer) from diffusing from the switching layer 16 into the top electrode. In some embodiments, the material of the barrier layer 18 is selected to obstruct diffusion of metal ions from a subsequently-formed metal ion source layer (e.g., the metal ion source layer 20) to the switching layer 16 during cycling and retention, thereby improving the cycling and retention performance of semiconductor device 10.

Examples of the material in the barrier layer 18 may include a metal nitride, a metal oxide, a metal silicide, the like, or combinations thereof. In some embodiments, the barrier layer 18 may include aluminum nitride, titanium nitride, tantalum nitride, tungsten nitride, tantalum tungsten nitride, ruthenium titanium nitride, ruthenium tantalum nitride, tantalum silicon nitride, tantalum germanium oxynitride (Ta—Ge—(O)N), the like, or combinations thereof. In some embodiments, the barrier layer 18 may include palladium (Pd), tantalum (Ta), hafnium (Hf), zirconium (Zr), niobium (Nb), cobalt (Co), ruthenium (Ru), the like, or a combination thereof.

The barrier layer 18 may be formed by any suitable method, such as CVD, ALD, PVD, or the like. In some embodiments, a thickness of the barrier layer 18 may be in a range between about 50 angstroms and about 300 angstroms, but is not limited to such dimensions. In the present embodiments, the barrier layer 18 is formed to include a metal nitride, such as aluminum nitride.

Figure 6:
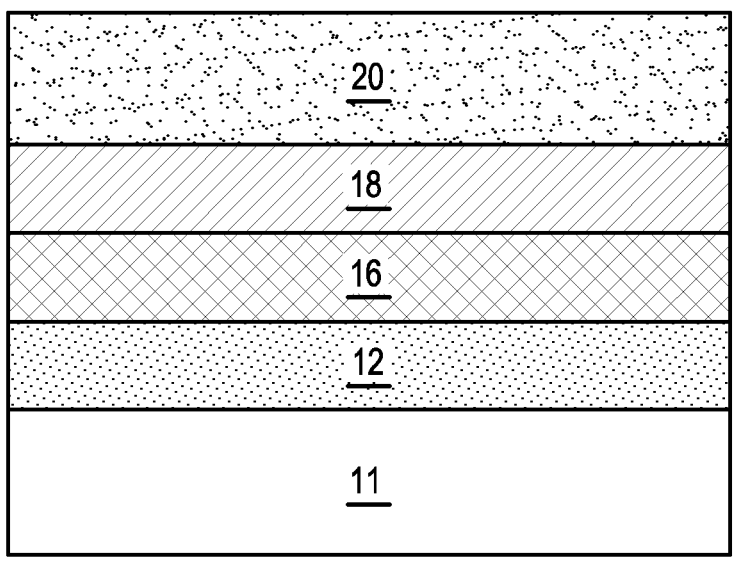

As shown in FIG. 6, the method 100 proceeds to operation 150 in which a metal ion source layer (alternatively referred to as a metal ion reservoir layer) 20 is formed over the barrier layer 18.

In some embodiments, the metal ion source layer 20 may include a metal nitride and/or a metal oxide. For example, the metal ion source layer 20 may include a nitride and/or an oxide of aluminum, titanium, tantalum, hafnium, the like, or combinations thereof. In the present embodiments, the metal ion source layer 20 has the same composition as the barrier layer 18. For example, the metal ion source layer 20 and the barrier layer 18 both include aluminum nitride. In some embodiments, the metal ion source layer 20 includes aluminum nitride but is free of oxygen. The metal ion source layer 20 may be formed by any suitable method, such as CVD, ALD, PVD, or the like.

The metal ion source layer 20 may be configured as a metal ion reservoir region to store metal ions such as aluminum ions, copper ions, silver ions, or the like, depending on the composition of the metal ion source layer 20. When a positive voltage is applied at the top electrode, the metal in the metal ion source layer 20 may be oxidized to form positively-charged metal ions, which subsequently migrate toward and through the switching layer 16 to establish conductive filaments (or conductive bridges) between the bottom electrode 12 and the top electrode.

Figure 7:
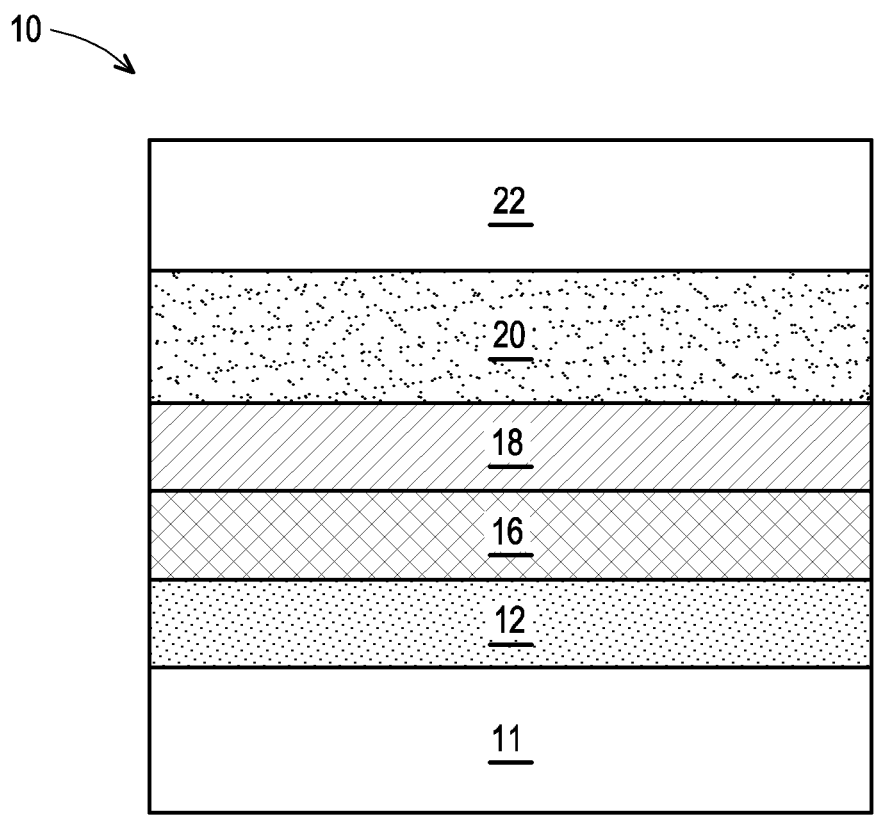

As shown in FIG. 7, the method 100 proceeds to operation 160 in which a top electrode 22 is formed over the metal ion source layer 20.

The top electrode 22 is formed from a conductive material. Examples of the conductive material for the top electrode 22 include a metal nitride, such as titanium nitride, tantalum nitride, or the like, a metal, such as tungsten, copper, gold, platinum, iridium, ruthenium, or the like, a doped semiconductor material, such as polycrystalline silicon or the like, or combinations thereof. In the present embodiments, the top electrode 22 includes a metal nitride, such as titanium nitride. In some embodiments, the top electrode 22 may serve as an anode (or an active electrode) of the semiconductor device 10.

Figure 8:
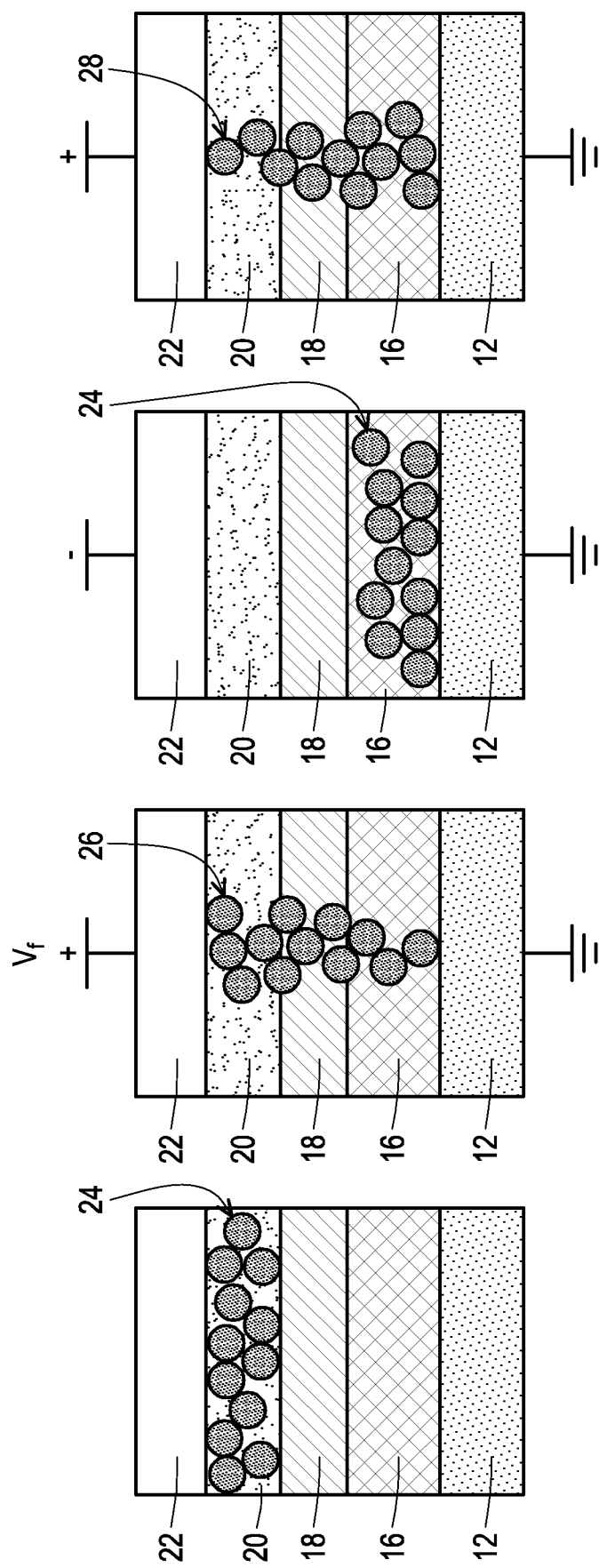
FIGS. 8A, 8B, 8C, and 8D are schematic diagrams illustrating different operational states of a semiconductor device, according to one or more embodiments of the present disclosure.

An overview of various operational states of the semiconductor device 10 is depicted in FIGS. 8A-8D and described briefly below. After fabricating the semiconductor device 10 as shown in FIG. 8A, an initialization operation is performed. Referring to FIG. 8B, the initialization operation may be performed by applying the forming voltage ($V_f$) across the top electrode 22 and the bottom electrode 12 to initially form a conductive filament 26 from metal ions 24. The metal ions 24 may be formed by oxidizing the metal in the metal ion source layer 20 at its interface with the top electrode 22. In some embodiments, the top electrode 22 is supplied with a positive voltage relative to the bottom electrode 12. The forming voltage may be applied to cause the metal ions 24 to migrate from the metal ion source layer 20 to and through the switching layer 16, thereby forming the conductive filament (i.e., increasing conductivity) 26 to lower resistance in the semiconductor device 10. The semiconductor device 10 reaches an ON-state. In the present embodiments, doping the switching layer 16 with nitrogen reduces the forming voltage needed to cause the migration of metal ions 24 to and through the switching layer 16.

Then, referring to FIG. 8C, a reset operation is performed by applying a reset voltage across the top electrode 22 and the bottom electrode 12 to switch the switching layer 16 from lower resistance state (LRS) to high resistance state (HRS). In some embodiments, the top electrode 22 is supplied with a negative voltage relative to the bottom electrode 12. The metal ions 24 move from the metal ion source layer 20 to the switching layer 16, thereby breaking the conductive filament 26 to increase resistance in the semiconductor device 10. The semiconductor device 10 reaches an OFF-state.

Subsequently, referring to FIG. 8D, a set operation is performed by applying a set voltage across the top electrode 22 and the bottom electrode 12 to switch the switching layer 16 from high resistance state (HRS) to lower resistance state (LRS). In some embodiments, the top electrode 22 is supplied with a positive voltage relative to the bottom electrode 12. The metal ions 24 migrate from the metal ion source layer 20 toward the switching layer 16, thereby forming a conductive filament 28 to lower resistance in the semiconductor device 10.

Figure 9:
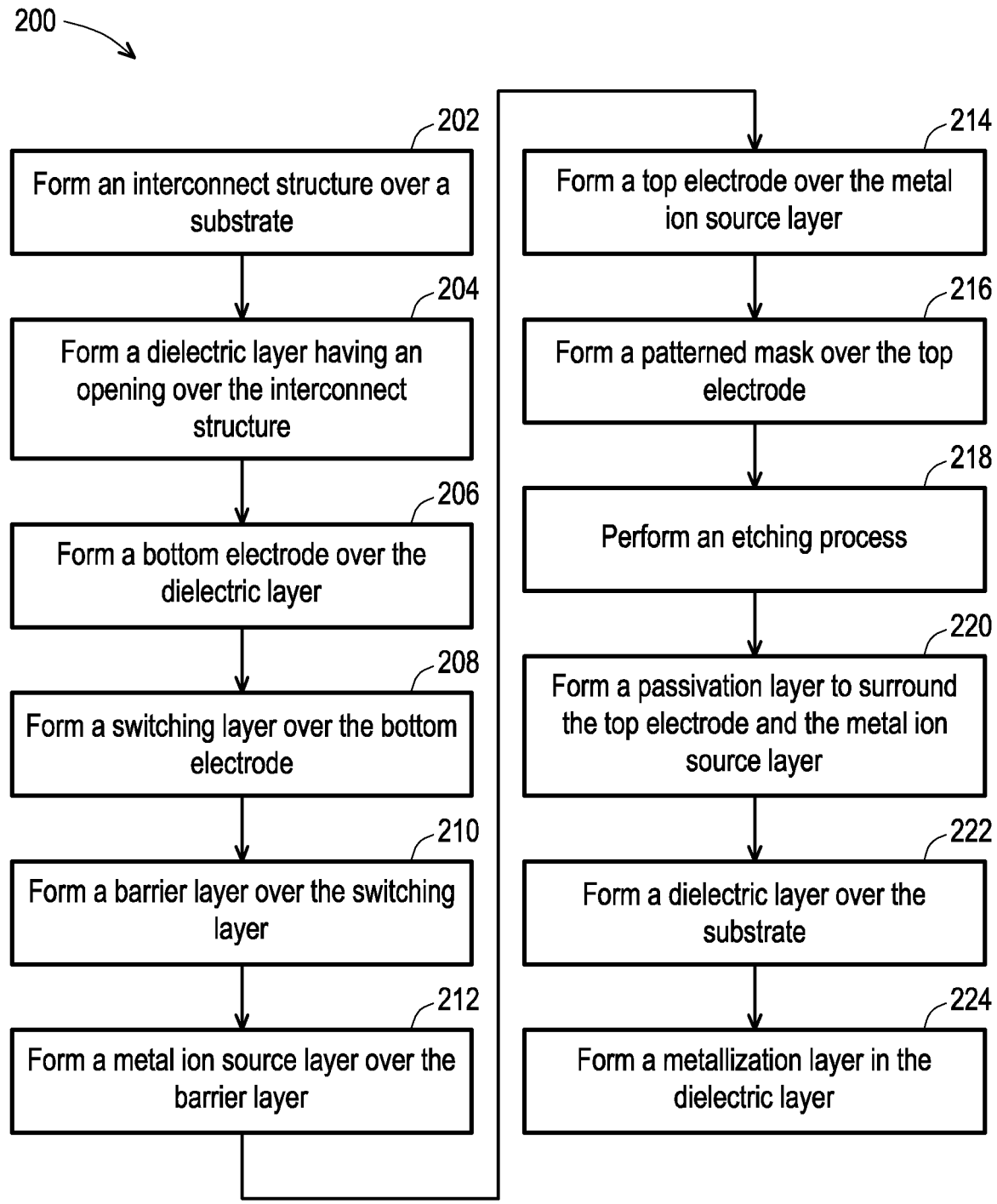
FIG. 9 is a flow chart illustrating a method for manufacturing a semiconductor device, according to various aspects of one or more embodiments of the present disclosure.

FIG. 9 is a flowchart illustrating a method 200 for manufacturing a semiconductor device 30 according to various aspects of one or more embodiments of the present disclosure. The method 200 begins with operation 202 in which a bottom interconnect structure 31 is formed over a substrate 11. The method 200 proceeds to operation 204 in which a dielectric layer 36 is formed over the bottom interconnect structure 31, the dielectric layer including an opening 38. The method 200 proceeds to operation 206 in which a bottom electrode 12 is formed over the dielectric layer 36. The method 200 proceeds to operation 208 in which a switching layer 16 is formed over the bottom electrode 12. The method 200 proceeds to operation 210 in which a barrier layer 18 is formed over the switching layer 16. The method 200 proceeds to operation 212 in which a metal ion source layer 20 is formed over the barrier layer 18. The method 200 continues with operation 214 in which a top electrode 22 is formed over the metal ion source layer 20. The method 200 continues with operation 216 in which a patterned mask 39 is formed over the top electrode 22. The method 200 proceeds to operation 218 in which an etching process is performed. The method 200 proceeds to operation 220 in which a passivation layer 40 is formed to surround the top electrode 22 and the metal ion source layer 20. The method 200 continues with operation 222 in which a top ILD layer 42 is formed over the substrate 11. The method 200 continues with operation 224 in which a top metallization layer 44 is formed in the top ILD layer 42.

The method 100 is described in reference to FIGS. 10-19, which are cross-sectional schematic views of a semiconductor device 30 at intermediate stages of the method 200 according to some embodiments of the present disclosure. The method 200 is merely an example to form a conductive bridge random access memory (CBRAM), and is not intended to limit the present disclosure beyond what is explicitly recited in the claims. Additional operations can be provided before, during, and after the method 900, and some operations described can be replaced, eliminated, or moved around for additional embodiments of the method.

Figure 10:
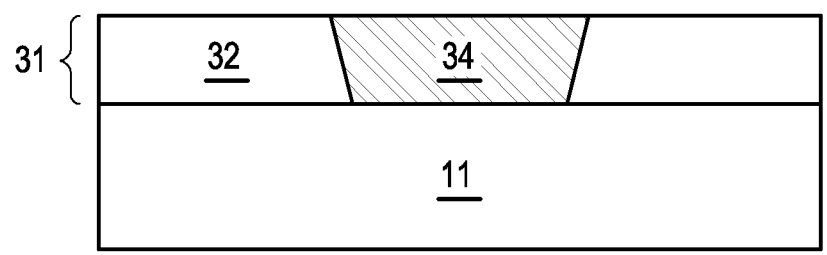
FIGS. 10, 11, 12, 13, 14, 15, 16, 17, 18, and 19 cross-sectional schematic views of a semiconductor device at various operations of the method as shown in FIG. 9, according to one or more embodiments of the present disclosure.

As shown in FIG. 10, the method 200 begins with operation 202 in which a bottom interconnect structure 31 is formed over the substrate 11, which is described in detail above. In some embodiments, the bottom interconnect structure 31 includes a bottom metallization layer 34 and a bottom inter-layer dielectric (ILD) layer 32 laterally surrounding the bottom metallization layer 34. In some embodiments, the bottom metallization layer 34 may be one layer of the back-end-of-the line (BEOL). In some embodiments, the material of the bottom metallization layer 34 may include a metal or an alloy including copper, tungsten, alloys thereof, or the like. The material of the bottom ILD layer 32 may include a dielectric material, such as silicon oxide, a low-k dielectric material with a dielectric constant less than 2.0, the like, or combinations thereof, though other suitable materials are also applicable in the present disclosure.

Figure 11:
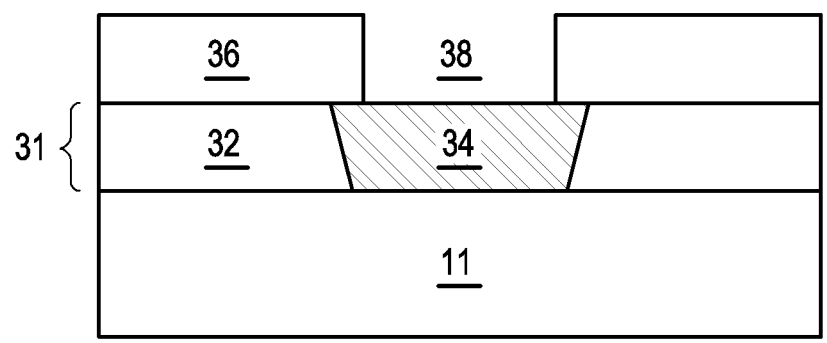

As shown in FIG. 11, the method 200 proceeds to operation 204 in which a dielectric layer 36 is formed over the substrate 11. In some embodiments, the dielectric layer 36 is formed over the bottom interconnect structure 31 and includes an opening 38 exposing a portion of the bottom metallization layer 34. In some embodiments, the dielectric layer 36 may include a dielectric material, such as silicon oxide, silicon nitride, silicon oxynitride or the like.

Figure 12:
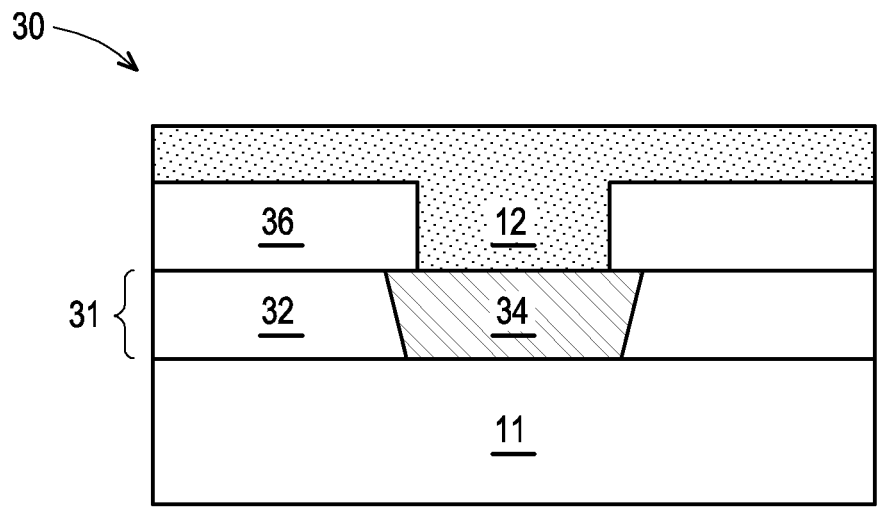

As shown in FIG. 12, the method 200 proceeds to operation 206 in which the bottom electrode 12 is formed over the dielectric layer 36, thereby filling the opening 38, to electrically connect to the exposed bottom metallization layer 34. The bottom electrode 12 may be formed in a manner according to operation 110 of the method 100 described in detail above. In some embodiments, the bottom electrode 12 may be formed to have a substantially planar upper surface.

Figure 13:
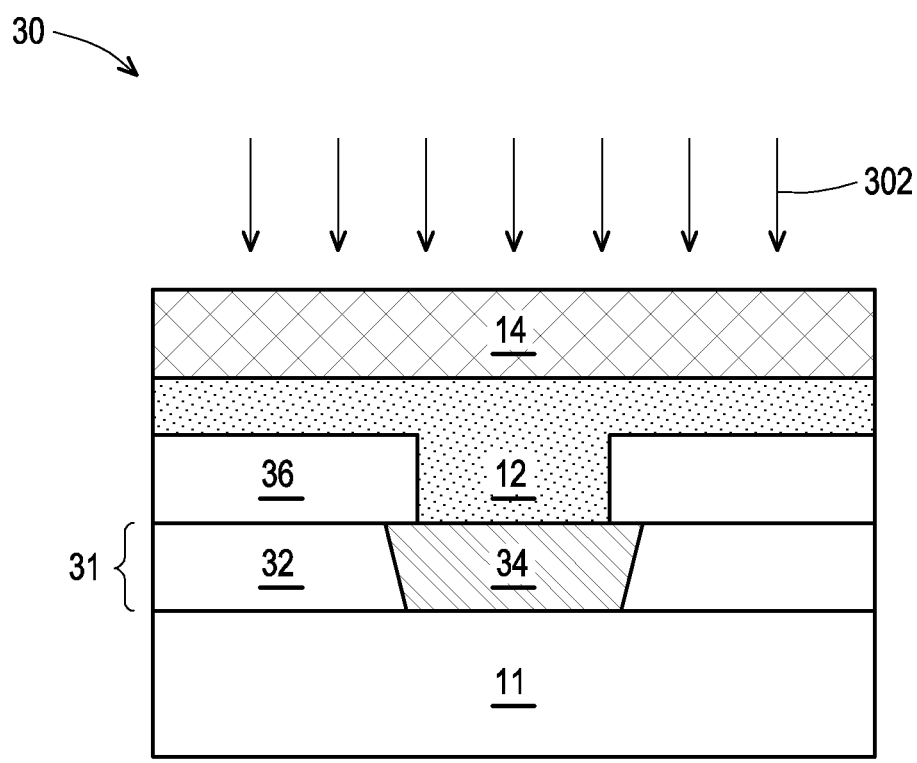
Figure 14:
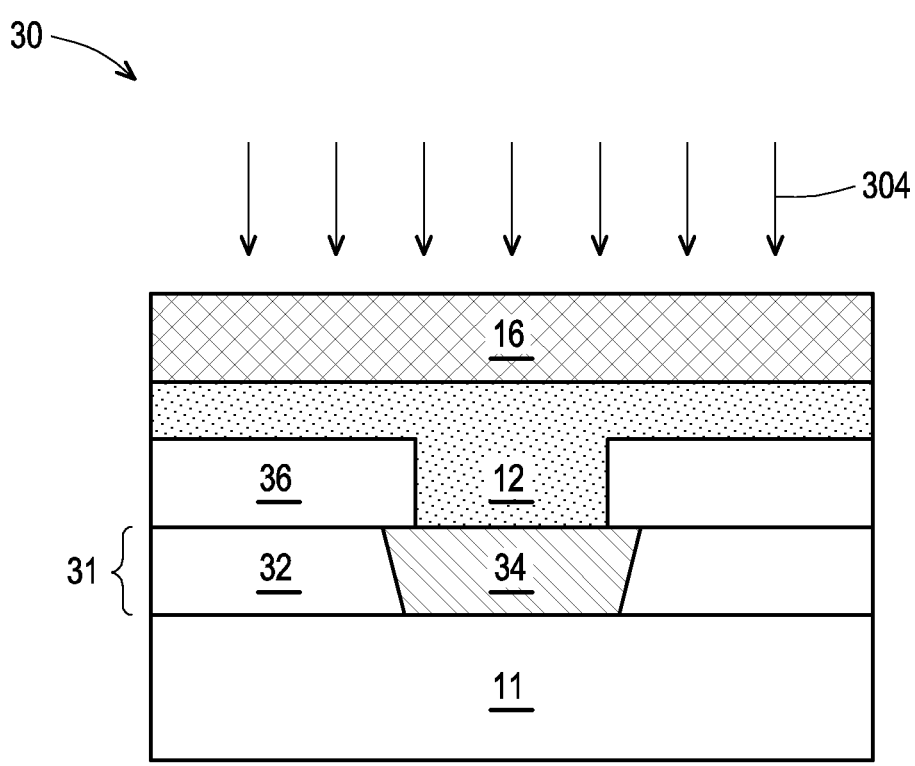

As shown in FIGS. 13 and 14 collectively, the method 200 proceeds to operation 208 in which the switching layer 16 is formed over the bottom electrode 12. The switching layer 16 may be formed in a manner according to operations 120 and 130 of the method 100 described in detail above. For example, referring to FIG. 13, the metal oxide layer 14 is formed over the bottom electrode 12 by the deposition process 302, which may be a PVD process or a CVD process, where the metal oxide layer 14 includes aluminum oxide according to some embodiments. Subsequently, referring to FIG. 14, the nitrogen treatment 304 is performed to dope the metal oxide layer 14 with nitrogen, thereby forming a nitrogen-containing metal oxide, such as a nitrogen-containing (or nitrogen-doped) aluminum oxide (AlON), in the switching layer 16. The nitrogen treatment 304 is implemented as a nitrogen plasma, which may be generated by a CCP source in a PVD processing chamber or a CVD processing chamber. The amount of nitrogen formed in the resulting switching layer 16 may be about 5 atomic % to about 10 atomic %.

Figure 15:
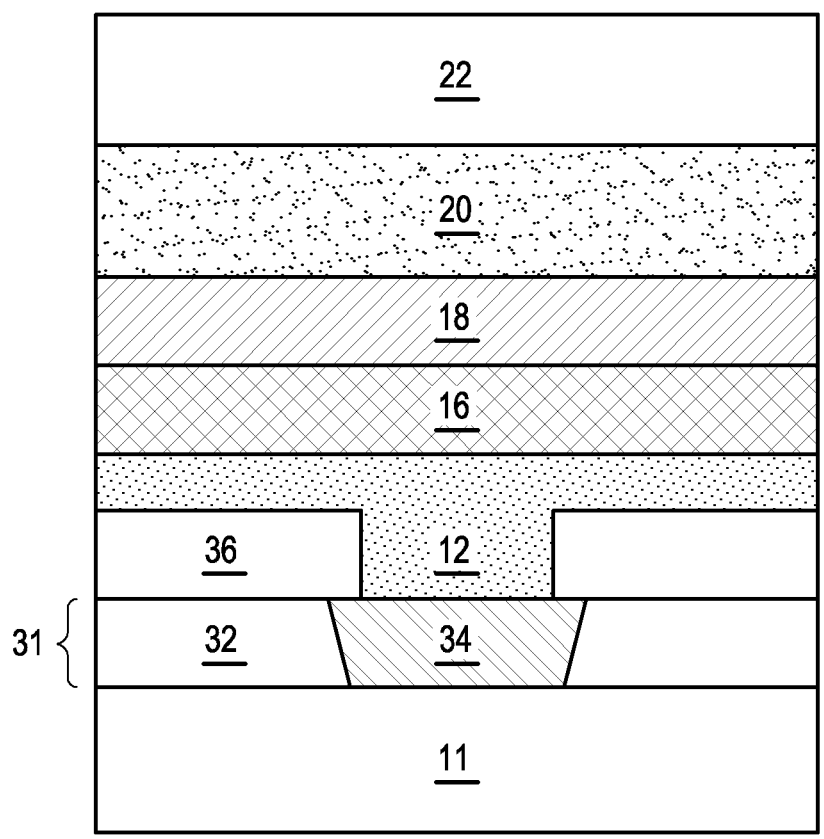

As shown in FIG. 15, the method 200 continues with operations 210, 212, and 214 in which the barrier layer 18, the metal ion source layer 20, and the top electrode 22, respectively, are formed over the bottom electrode 12. In some embodiments, the metal ion source layer 20 is formed over the switching layer 16 prior to the formation of the top electrode 22. The barrier layer 18, the metal ion source layer 20, and the top electrode 22 may have substantially planar upper surface as the bottom electrode 12. The barrier layer 18, the metal ion source layer 20, and the top electrode 22 may be formed in a manner according to operations 140, 150, and 160 of the method 100, respectively, described in detail above.

Figure 16:
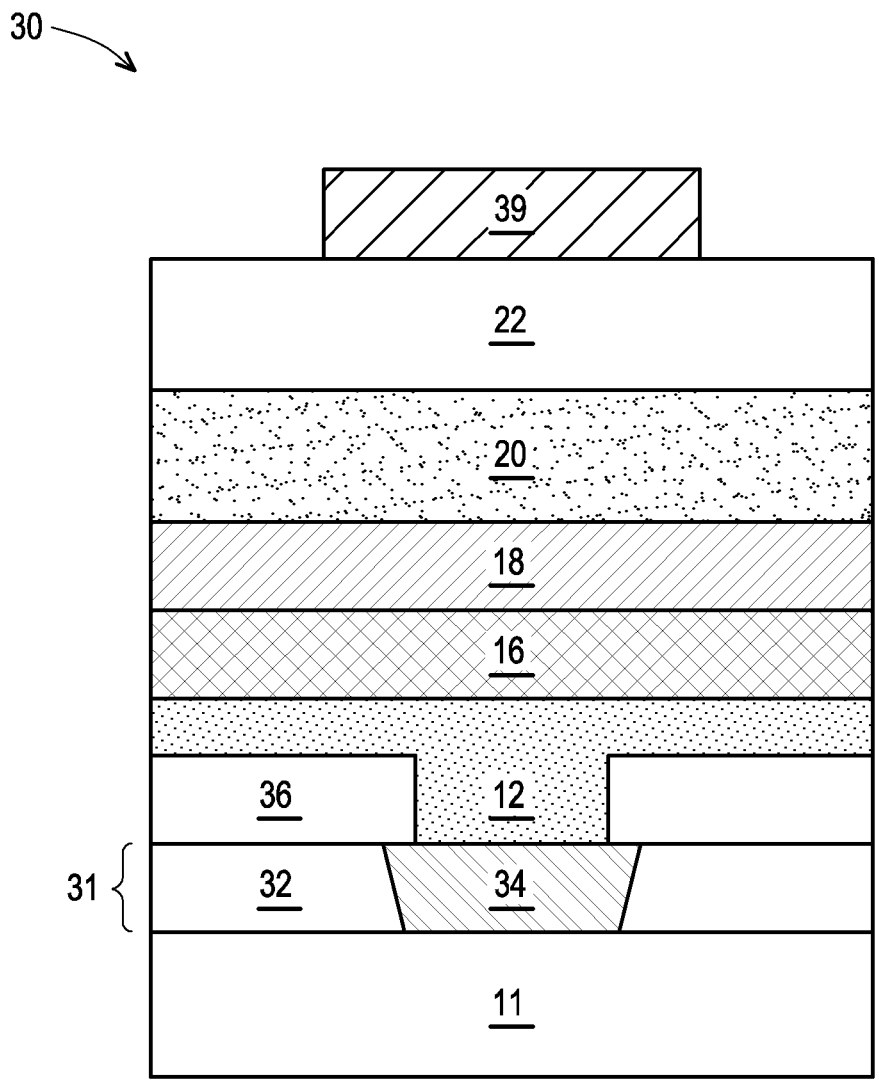

As shown in FIG. 16, the method 200 continues with operation 216 in which a patterned mask layer 39 is formed over the top electrode 22. The patterned mask layer 39 covers a portion of the top electrode 22. In some embodiments, the patterned mask layer 39 may include a photoresist layer, but is not limited thereto.

Figure 17:
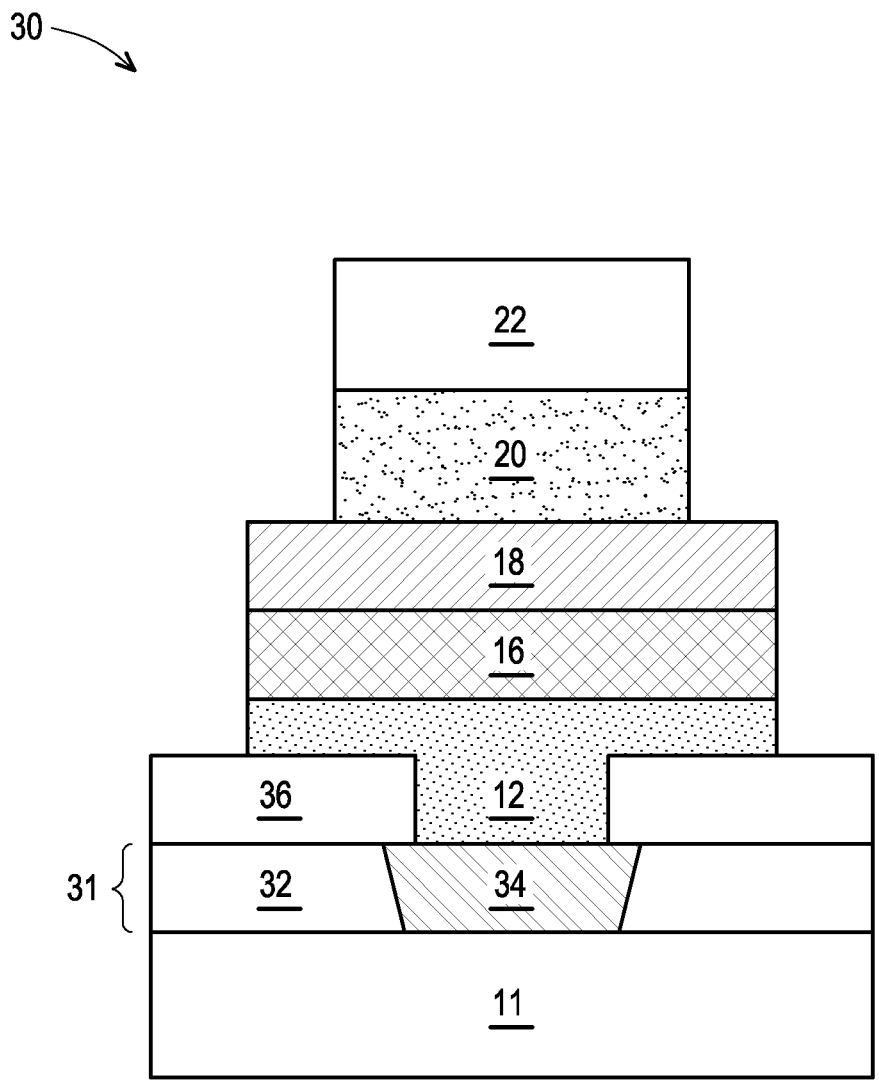

As shown in FIG. 17, the top electrode 22, the metal ion source layer 20, the barrier layer 18, the switching layer 16, and the bottom electrode 12 are patterned. In some embodiments, the patterned mask layer 39 is used as an etching mask to the top electrode 22, the metal ion source layer 20, the barrier layer 18, the switching layer 16, and the bottom electrode 12 in a dry etching process, a wet etching process, or a combination thereof. The etching may be performed in a single operation or in multiple operations. In some embodiments, a width of the top electrode 22 and the metal ion source layer 20 may be smaller than that of the barrier layer 18, the switching layer 16, and the bottom electrode 12 after etching, and a portion of the upper surface of the barrier layer 18 may be exposed. In some embodiments, sidewalls of the barrier layer 18 may be partially etched to form a slanted profile (not depicted). The patterned mask layer 39 may be removed after performing the etching process.

Figure 18:
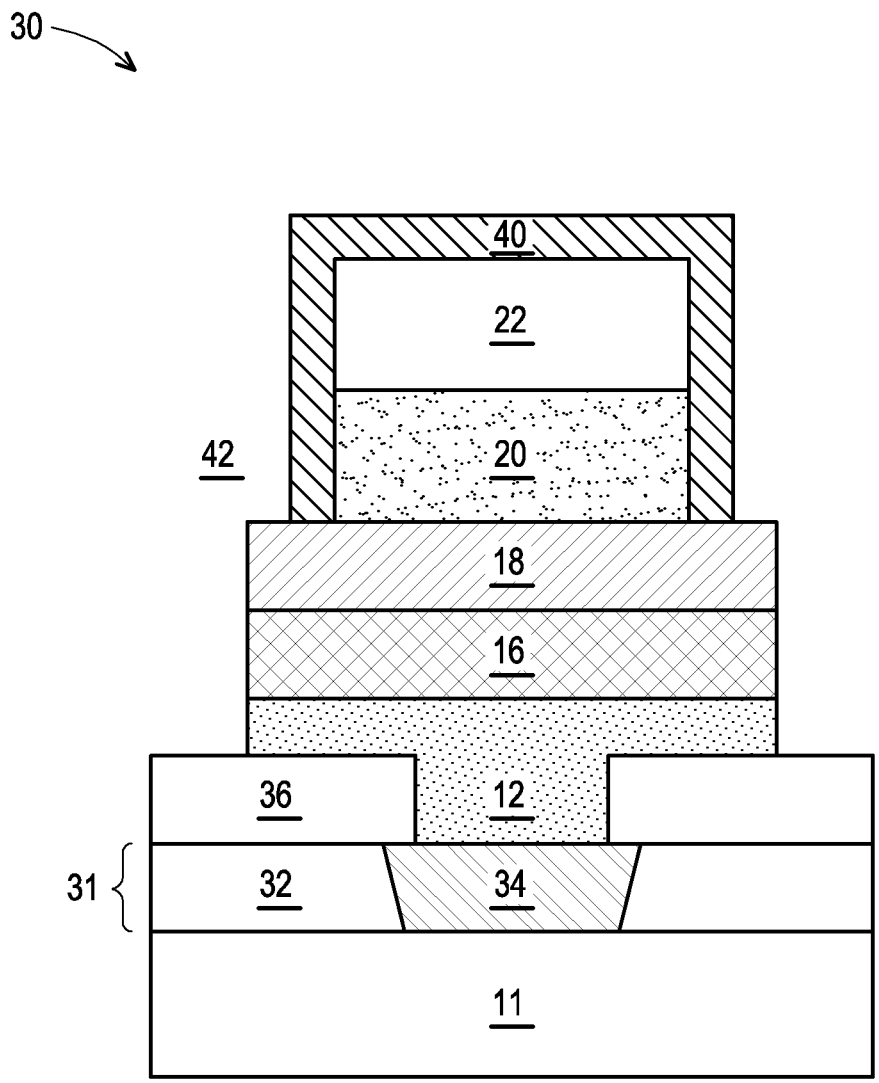

As shown in FIG. 18, a passivation layer 40 can be optionally formed over the semiconductor device 10. In some embodiments, the passivation layer 40 includes an insulation material. In some embodiments, the passivation layer 40 covers the upper surface of the top electrode 22. In some embodiments, the passivation layer 40 covers edges of the top electrode 22 and the metal ion source layer 20. In some embodiments, the passivation layer 40 further covers a portion of the barrier layer 18. In some embodiments, the passivation layer 40 includes a dielectric material, such as silicon oxide, silicon nitride, silicon oxynitride, or the like, but is not limited thereto.

Figure 19:
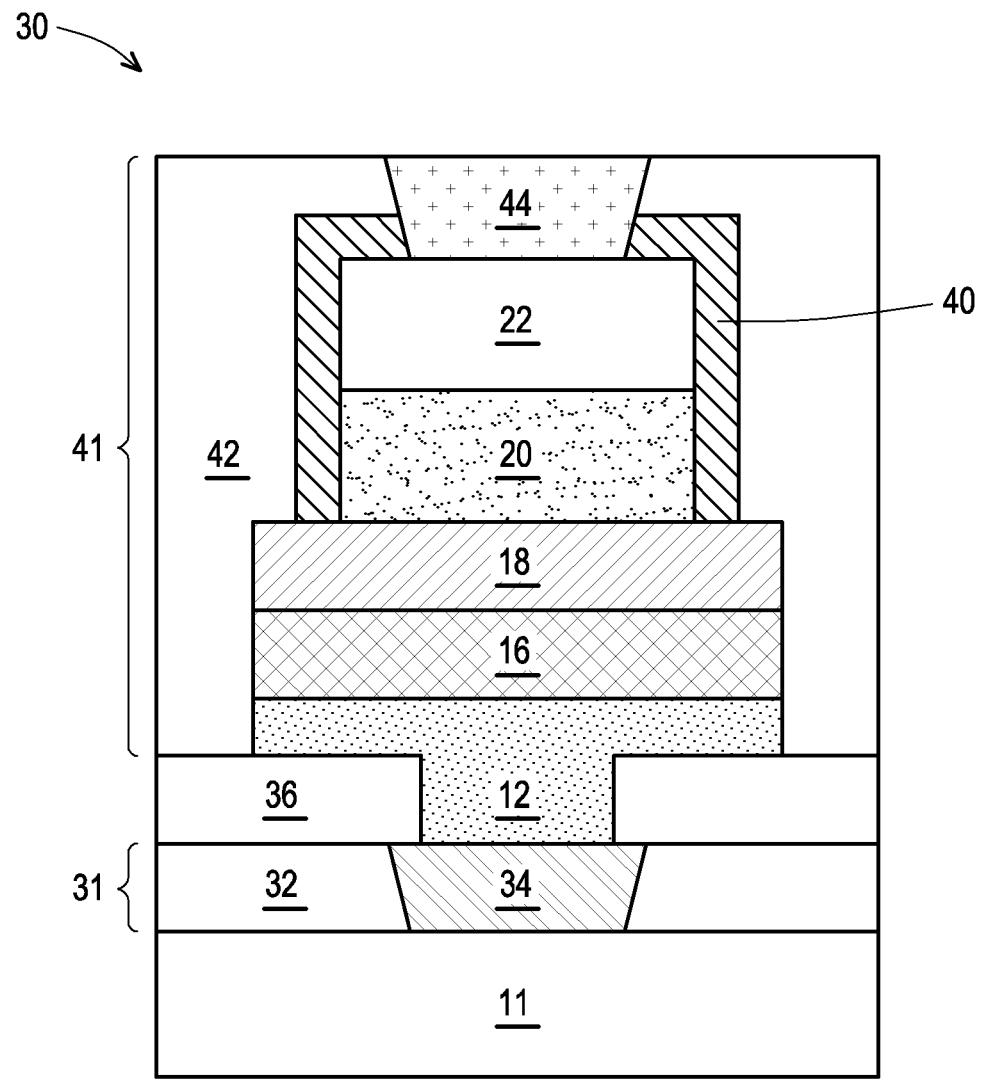

As shown in FIG. 19, a top ILD layer 42 is formed over the substrate 11, covering the passivation layer 40. In some embodiments, the top ILD layer 42 may include a dielectric material, such as low-k dielectric material with a dielectric constant less than 2.0 or the like, but is not limited thereto. The top ILD layer 42 and the passivation layer 40 may be patterned by, e.g., photolithography and etching technique, to expose a portion of the top electrode 22. In some embodiments, a top metallization layer 44 is formed, and electrically connected to the top electrode 22 to form a semiconductor device 30. In some embodiments, the top metallization layer 44 may include metal or alloy, such as copper, tungsten, alloy thereof or the like. In some embodiments, the top metallization layer 44 and the top ILD layer 42 form a top interconnect structure 41.

In the present embodiments, the semiconductor device 30 is a planar type semiconductor device, in which the top electrode 22, the metal ion source layer 20, the barrier layer 18, the switching layer 16, and the bottom electrode 12 may have planar upper surfaces. In some embodiments, though not depicted, the semiconductor device 30 may be a non-planar type semiconductor device, in which the upper surface of the bottom electrode 12 is recessed. In some embodiments, the upper surfaces of the top electrode 22, the metal ion source layer 20, the barrier layer 18, and the switching layer 16 may be non-planar, e.g., recessed.

In some embodiments, the semiconductor device 30 may be driven by a transistor device, such as a transistor device formed over the substrate 11. By way of example, the bottom metallization layer 34 may be electrically connected to a drain electrode of the transistor device. The source electrode of the transistor device may be electrically connected to a source line, and the gate electrode of the transistor device may be electrically connected to a word line. The top metallization layer 44 may be electrically connected to a bit line.

Figure 20:
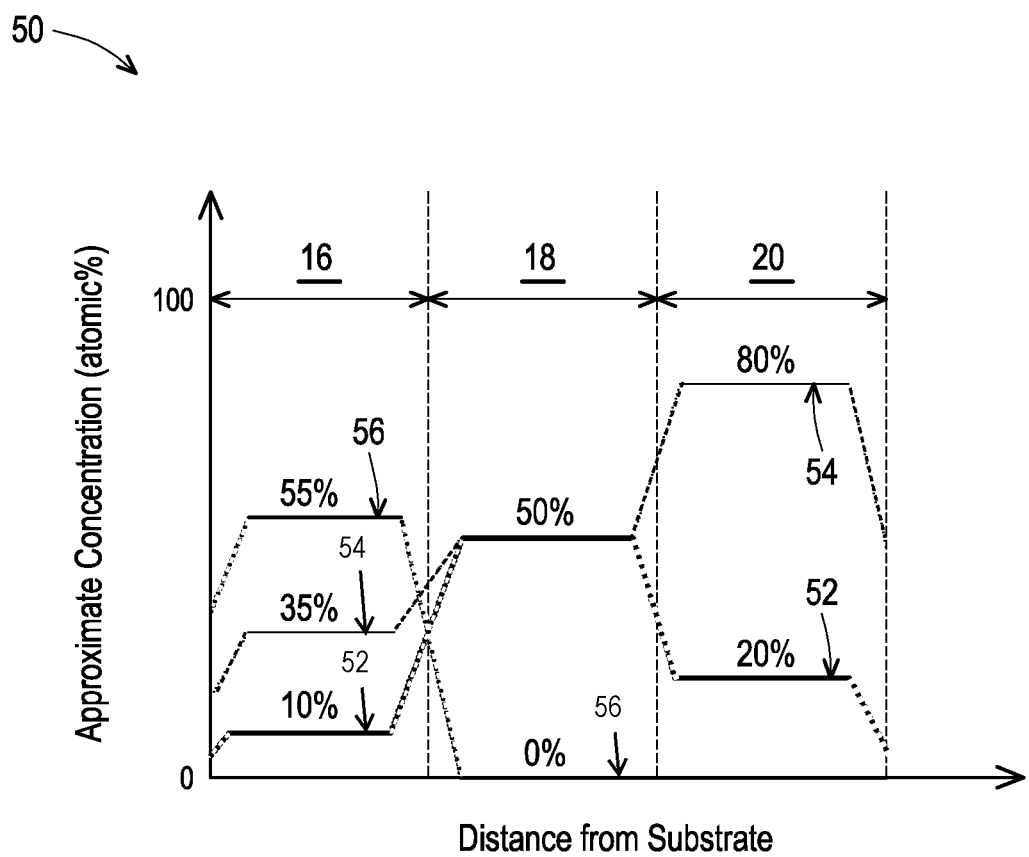
FIG. 20 is a schematic illustration of concentration distribution of various elements in a semiconductor device, according to one or more embodiments of the present disclosure.

FIG. 20 depicts an example concentration distribution schematic 50 of various elements (e.g., nitrogen, aluminum, and oxygen) present in the semiconductor device 20 and/or 30 described in detail above. In the present example, the embodiment depicted in FIG. 20 corresponds to the semiconductor device 20 and/or 30 with the switching layer 16 including nitrogen-doped aluminum oxide (AlON), the barrier layer 18 including aluminum nitride (AlN), and the metal ion source layer 20 also including aluminum nitride (AlN). In some embodiments, the AlN-containing barrier layer 18 and the AlN-containing metal ion source layer 20 are deposited in the same chamber as the nitrogen treatment 304 (e.g., the PVD chamber). By varying the flow rate of nitrogen, different concentrations of nitrogen, as described in detail below, in the switching layer 16, the barrier layer 18, and the metal ion source layer 20 can be achieved. For example, increasing the flow rate of nitrogen may lead to an increased concentration of nitrogen in the various layers.

The concentration distribution of nitrogen, aluminum, and oxygen is described by curves 52, 54, and 56, respectively. Each of the curves 52, 54, and 56 describes changes in an approximate concentration (in atomic %) of an element as function of distance (e.g., a distance from the substrate 11, where the position of the substrate 11 is taken to be "0" for purposes of simplicity). Of note, solid segments of each of the curves 52, 54, and 56 represent average concentration levels of a given element in bulk regions of the layers 16, 18, and 20, respectively, which may remain approximately constant. In contrast, dashed segments of the curves 52, 54, and 56 represent concentration levels of a given element in interfacial regions between two adjacent layers of the layers 16, 18, and 20, which may be generally graded (e.g., increasing or decreasing gradually) across each interfacial region. In some embodiments, the gradation of concentration of a given element across each interfacial region is attributed to diffusion of the element toward equilibrium states after the formation of the layers 16, 18, and 20. In this regard, the dashed segments schematically illustrate trends of such gradations and should not be considered limiting for the embodiments of the present disclosure. For example, slopes of the dashed segments may vary between different interfacial regions of the semiconductor device 20 and/or 30 for a given element.

In the depicted embodiment, the bulk region of the switching layer 16 is shown to include about 10% nitrogen, about 35% aluminum, and about 55% oxygen. In some embodiments, as provided herein, the concentration of nitrogen may range from about 5% to about 10%, and the concentration of oxygen may range from about 55% to about 60% accordingly. In the depicted embodiment, the bulk region of the barrier layer 18 is shown to include about 50% of nitrogen and about 50% of aluminum, and the bulk region of the metal ion source layer 20 is shown to include about 20% nitrogen and about 80% aluminum. In this regard, the concentration of nitrogen may first increase from the switching layer 16 toward the barrier layer 18 and then decrease toward the metal ion source layer 20; the concentration of aluminum may generally increase from the switching layer 16 toward the barrier layer 18, and continue to increase toward the metal ion source layer 20; and the concentration of oxygen may generally decrease from the switching layer 16 toward the metal ion source layer 20 and may remain at about 0% in the bulk regions of the barrier layer 18 and the metal ion source layer 20. Various concentration levels depicted in FIG. 20 are for illustration purposes only and should limit the embodiments of the present disclosure.

In one aspect, the present disclosure provides a semiconductor device that includes a semiconductor substrate, a bottom electrode over the semiconductor substrate, a switching layer over the bottom electrode, a metal ion source layer over the switching layer, and a top electrode over the metal ion source layer. The switching layer includes a compound having aluminum, oxygen, and nitrogen.

In another aspect, the present disclosure provides a method of fabricating a semiconductor device that includes forming a bottom electrode over a semiconductor substrate. The method includes forming a switching layer over the bottom electrode. The method includes forming a metal ion reservoir layer over the switching layer. The method includes forming a top electrode over the metal reservoir layer. Forming the switching layer includes depositing an aluminum oxide layer and performing a nitrogen treatment to the aluminum oxide layer.

In yet another aspect, the present disclosure provides a method of fabricating a semiconductor device that includes forming a first electrode over a substrate. The method includes depositing a metal oxide layer over the first electrode. The method includes treating the metal oxide layer with nitrogen to form an oxygen-and-nitrogen-containing switching layer. The method includes forming a metal ion source layer over the switching layer. The method includes forming a second electrode over the metal ion source layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor substrate;
a bottom electrode over the semiconductor substrate;
a switching layer over the bottom electrode, wherein the switching layer includes a compound having aluminum, oxygen, and nitrogen;
a metal ion source layer over the switching layer; and
a top electrode over the metal ion source layer;
wherein the compound is a first aluminum-containing compound having a first bandgap and the metal ion source layer includes a second aluminum-containing compound having a second bandgap, and wherein the first bandgap is greater than the second bandgap.

2. The semiconductor device of claim 1, further comprising a barrier layer between the switching layer and the metal ion source layer.

3. The semiconductor device of claim 2, wherein the barrier layer and the metal ion source layer have the same composition.

4. The semiconductor device of claim 1, wherein the metal ion source layer includes aluminum and nitrogen but is free of oxygen.

5. The semiconductor device of claim 1, wherein an amount of nitrogen in the switching layer ranges from 5 atomic % to 10 atomic %.

6. The semiconductor device of claim 1, wherein an amount of oxygen in the switching layer ranges from 55 atomic % to 60 atomic %.

7. The semiconductor device of claim 1, wherein a thickness of the switching layer ranges from 10 angstroms to 40 angstroms.

8. A method, comprising:
forming a bottom electrode over a semiconductor substrate;
forming a switching layer over the bottom electrode, including:
depositing an aluminum oxide layer; and
performing a nitrogen treatment to the aluminum oxide layer, thereby forming the switching layer;
forming a metal ion reservoir layer over the switching layer; and
forming a top electrode over the metal ion reservoir layer.

9. The method of claim 8, wherein the depositing of the aluminum oxide layer is implemented using a physical vapor deposition process and the performing of the nitrogen treatment is implemented using a chemical vapor deposition process.

10. The method of claim 8, wherein the performing of the nitrogen treatment reduces a density of the aluminum oxide layer.

11. The method of claim 8, wherein the performing of the nitrogen treatment reduces a bandgap of the aluminum oxide layer.

12. The method of claim 8, further comprising forming a barrier layer between the switching layer and the metal ion reservoir layer.

13. The method of claim 12, wherein the barrier layer and the metal ion reservoir layer both include nitrogen, and wherein a concentration of nitrogen increases from the switching layer toward the barrier layer and subsequently decreases toward the metal ion reservoir layer.

14. The method of claim 8, wherein the metal ion reservoir layer includes aluminum nitride layer but is free of oxygen.

15. A method, comprising:
forming a first electrode over a substrate;
depositing a metal oxide layer over the first electrode;
treating the metal oxide layer with nitrogen to form an oxygen-and-nitrogen-containing switching layer;
forming a metal ion source layer over the oxygen-and-nitrogen-containing switching layer; and
forming a second electrode over the metal ion source layer.

16. The method of claim 15, wherein the nitrogen is produced by a capacitively-coupled plasma source.

17. The method of claim 15, wherein the metal oxide layer includes aluminum oxide.

18. The method of claim 15, wherein the depositing of the metal oxide layer is implemented by a physical vapor deposition process and the treating of the metal oxide layer is implemented by a chemical vapor deposition process.

19. The method of claim 15, wherein the treating of the metal oxide layer increases an amount of nitrogen in the metal oxide layer to a range of 5 atomic % to 10 atomic %.

20. The method of claim 15, further comprising forming a barrier layer over the oxygen-and-nitrogen-containing switching layer.

* * * * *